(12) United States Patent
Sogani

(10) Patent No.: US 8,587,069 B1
(45) Date of Patent: Nov. 19, 2013

(54) MODIFIED ELECTROSTATIC DISCHARGE ARRANGEMENT WITHIN A SINGLE MULTIPLE-INTEGRATED CIRCUIT PACKAGE

(75) Inventor: Dhiraj Sogani, San Jose, CA (US)

(73) Assignee: Wi2Wi, Inc., San Jose, CA (US)

( * ) Notice: Subject to any disclaimer, the term of this patent is extended or adjusted under 35 U.S.C. 154(b) by 1352 days.

(21) Appl. No.: 12/104,349

(22) Filed: Apr. 16, 2008

(51) Int. Cl.
*H01L 23/62* (2006.01)
(52) U.S. Cl.
USPC ............................ 257/355; 257/360; 257/713
(58) Field of Classification Search
USPC .......................... 257/355, 360, 713
See application file for complete search history.

(56) References Cited

U.S. PATENT DOCUMENTS 7,009,253 B2 * 3/2006 Rodov et al. .................. 257/355

* cited by examiner

*Primary Examiner* — Douglas Menz
(74) *Attorney, Agent, or Firm* — IPSG, P.C. Intellectual Property Law

(57) ABSTRACT

A single package arrangement is provided. The arrangement includes a set of electronic components. The arrangement also includes a set of input/output (I/O) cells, which is encapsulated within the set of electronic components. The arrangement further includes a set of electrostatic discharge (ESD) arrangements. Each ESD arrangement of the set of ESD arrangements is configured for at least coupling with an I/O cell of the set of I/O cells and protecting the I/O cell from the electrostatic discharge using a set of ESD constructs. The set of ESD constructs includes at most two non-configurable ESD constructs to protect the I/O cell from the electrostatic discharge.

12 Claims, 5 Drawing Sheets

MODIFIED ELECTROSTATIC DISCHARGE ARRANGEMENT WITHIN A SINGLE MULTIPLE-INTEGRATED CIRCUIT PACKAGE

BACKGROUND OF THE INVENTION

Integrated circuits have become ubiquitous enabling the proliferation of portable electronic devices, such as smart devices, mobile telephones, personal digital assistant, laptop, and the like. In recent years, the demand for portable electronic devices to become smaller while integrating additionally functionality has created a challenge for manufacturers of integrated circuits.

A challenge faced by manufacturer in creating smaller electronic devices is the handling of electrostatic discharge (ESD) that may cause the electronic device to either experience performance degradation or may even cause the integrated circuits of the electronic device to be "fried", thereby making the electronic device inoperable. To facilitate discussion, FIG. 1 shows a simple block diagram of a printed circuit board (PCB) with an integrated circuit arrangement. A PCB 102 may include a plurality of package parts, such as package parts 104 and 106.

Each package part may include a plurality of input/output (I/O) cells, such as I/O cells 108, 110, 112, and 114. Each I/O cell may have a pin extending outward enabling each I/O cell to interact with other electronic components. In an example, I/O cells 108 and 112 may each have a pin extending outward from PCB 102 enabling each of the I/O cell to interact with other electronic parts (e.g., package parts) along a path 148 and 150, respectively. In another example, I/O cells 110 (e.g., as an output buffer) and 114 (e.g., as an input buffer) may each have a pin extended outward enabling I/O cell 110 and I/O cell 114 to interact with one another along a path 152.

As aforementioned, electrostatic discharge can cause serious damage to an integrated circuit. Those skilled in the arts are aware that electrostatic discharge is a flow of current between two or more objects due to different electrical potentials. A common practice in the art is to include an ESD protective module. In an example, to prevent ESD from damaging each of the I/O cell, an ESD protective module (116, 118, 120, and 122) may be attached to each I/O cell.

Those skilled in the arts are aware that electrostatic discharge may be derived from different sources. To handle the different types of electrostatic discharge, the ESD protective module may include different ESD components, such as a human body model (HBM) component, a charged device model (CDM) component, and a machine model (MM) component. In an example, ESD protective module 116 may include a HBM component 124, a CDM component 126, and a MM component 128. Similar components may exist in the other ESD protective modules (118, 120, and 122). Those skilled in the arts are aware that a HBM component may be employed to handle electrostatic discharge that may be generated when a static charge is created by a human handling the integrated circuit. In regard to a CDM component, a CDM component may be utilized to handle electrostatic charge that may be generated when the integrated circuit is within close proximity to another charged device. Meanwhile, a MM component may be employed to handle electrostatic discharge created when the integrated circuit comes into contact with a metal surface.

By coupling to an ESD protective module, an I/O cell may be protected from electrostatic discharge, thereby preventing performance degradation or performance failure to the I/O cell. Although an ESD protective module prevents an integrated circuit from damage due to electrostatic charge, integrated circuit with an ESD protective module may experience performance delay. In other words, before I/O cell 110 may interact with I/O cell 114, ESD protective module 120 may have to perform its function of checking for possible electrostatic discharge, for example. In addition, the configuration of an I/O cell with an ESD protective module may take up considerable space within a package part. Thus, the consumer's demands for increase functionality within a smaller form factor may be limited by the size of the package parts.

BRIEF SUMMARY OF THE INVENTION

The invention relates, in an embodiment, to a single package arrangement. The arrangement includes a set of electronic components. The arrangement also includes a set of input/output (I/O) cells, which is encapsulated within the set of electronic components. The arrangement further includes a set of electrostatic discharge (ESD) arrangements. Each ESD arrangement of the set of ESD arrangements is configured for at least coupling with an I/O cell of the set of I/O cells and protecting the I/O cell from the electrostatic discharge using a set of ESD constructs. The set of ESD constructs includes at most two non-configurable ESD constructs to protect the I/O cell from the electrostatic discharge.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
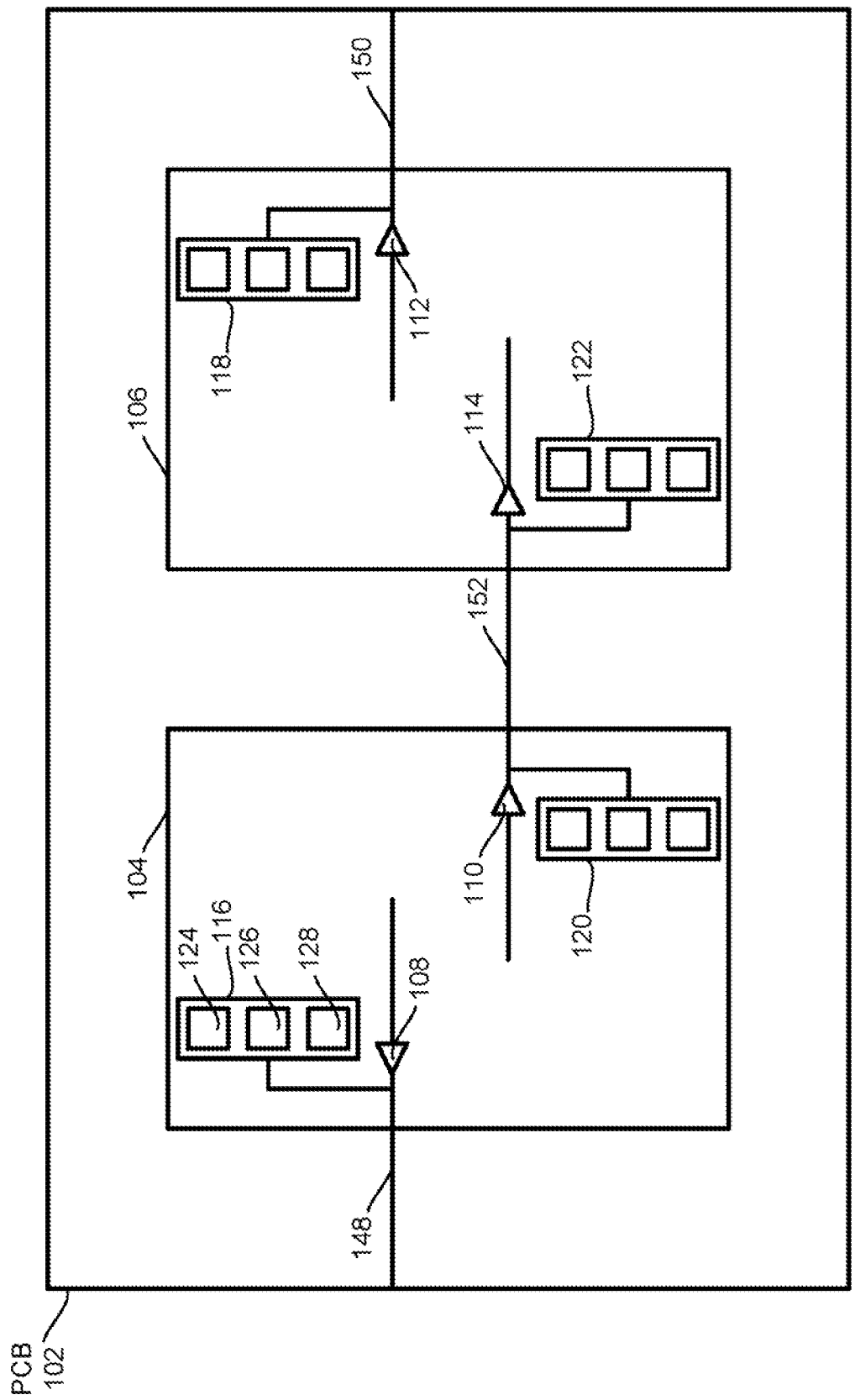
FIG. 1 shows a simple block diagram of a printed circuit board (PCB) with an integrated circuit arrangement.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, in recent years, the demands for electronic devices with smaller form factor have risen. An arrangement that may facilitate the small form factor is enabled by a System-in Package (SiP). As discussed herein, a SiP refers to a single package that may integrate a plurality of electronic components (e.g., dies, package parts, etc.). In one aspect of the invention, the inventor herein realized that the electrostatic discharge that may be experienced by each I/O cell within a SiP may differ. Thus, the ESD protective module may be modified.

In accordance with embodiments of the invention, a single multiple-integrated circuit package with an ESD arrangement is provided. Embodiments of the invention include an ESD arrangement that may provide protection against electrostatic discharge while enabling the overall geometry of the SiP to be significantly smaller. Alternatively or additionally, embodiments of the invention also include an ESD arrangement that enables the ESD arrangement to be configurable, thereby enabling the electronic components to be protected from electrostatic discharge but at the same time improving performance.

In an embodiment of the invention, a single multiple-integrated circuit package may include a plurality of electronic components (e.g., dies, package parts, etc.). Although package parts may be employed instead of dies, those skilled in the arts are aware that dies are physically smaller than package parts. Further, dies are stackable; therefore, more dies may be incorporated within the same area in comparison to that of package parts. In addition, dies are relatively cheaper than package parts. Accordingly, by utilizing dies, SiP may have smaller form factor and may be less expensive to produce.

Each electronic component may include a plurality of I/O cells. Each I/O cell may be coupled to an ESD arrangement. Since the single multiple-integrated circuit package may be encapsulated, not all I/O cells may experience the same types of electrostatic discharge. In an example, I/O cells that may interact only with other I/O cells located within the single multiple-integrated circuit package may never experience electrostatic discharge created through a human touch or created by interacting with a charged device. As a result, the human body model (HBM) component and the charged device model (CDM) component may be superfluous ESD components.

In an embodiment of the invention, an ESD arrangement may be a compact ESD arrangement. A compact ESD arrangement is an arrangement that may not include all three ESD components (i.e., HBM component, CDM component, and MM component). In an embodiment, the compact ESD arrangement may include at most two ESD components.

Unlike the prior art ESD protective module, the compact ESD arrangement may only include components that may be required to handle the electrostatic discharge that an I/O cell may experience. In an example, for I/O cells that may never experience electrostatic discharge create by a human touch and/or a charged device, a compact ESD arrangement may only include a machine model (MM) component. By limiting the ESD arrangement to only the components that may be needed, the physical size of the compact ESD arrangement can be significantly reduced, As a result, by replacing the standard ESD arrangements with compact ESD arrangements, the overall physical size of a single multiple-integrated circuit may become significantly smaller. In addition, since the compact ESD arrangement has fewer components, less time and power are required to enable the compact ESD arrangement to perform its function; thus, less interference in the interaction between two or more I/O cells may occur, thereby improving performance between the I/O cells.

Alternatively or additionally, an ESD arrangement may also be a configurable ESD arrangement. In an embodiment, a configurable ESD arrangement may include all three ESD components (i.e., HBM component, CDM component, and MM component). Unlike the prior art ESD protective module, the components within a configurable ESD arrangement are optional. In other words, a set of switches may be provided to enable each component to be activated or deactivated based on user's discretion.

In an example, if an I/O cell is designed to interact with a device external to the single multiple-integrated circuit package, then the switches to each of the components may be turned on (set to "0") in order to activate the components. In another example, if an I/O cell is designed to only interact with other I/O cells within the same package, then the switches to the MM component may be turned on in order to activate the MM component and the switches to the other components may be turned off since the I/O cell is highly unlikely to experience electrostatic discharges related to human touch or to charged devices. With a configurable ESD arrangement, overall performance for the I/O cell may improve since only components that are required are activated. Therefore, unnecessary delay may be substantially eliminated.

The features and advantages of the present invention may be better understood with reference to the figures and discussions that follow.

Figure 2:
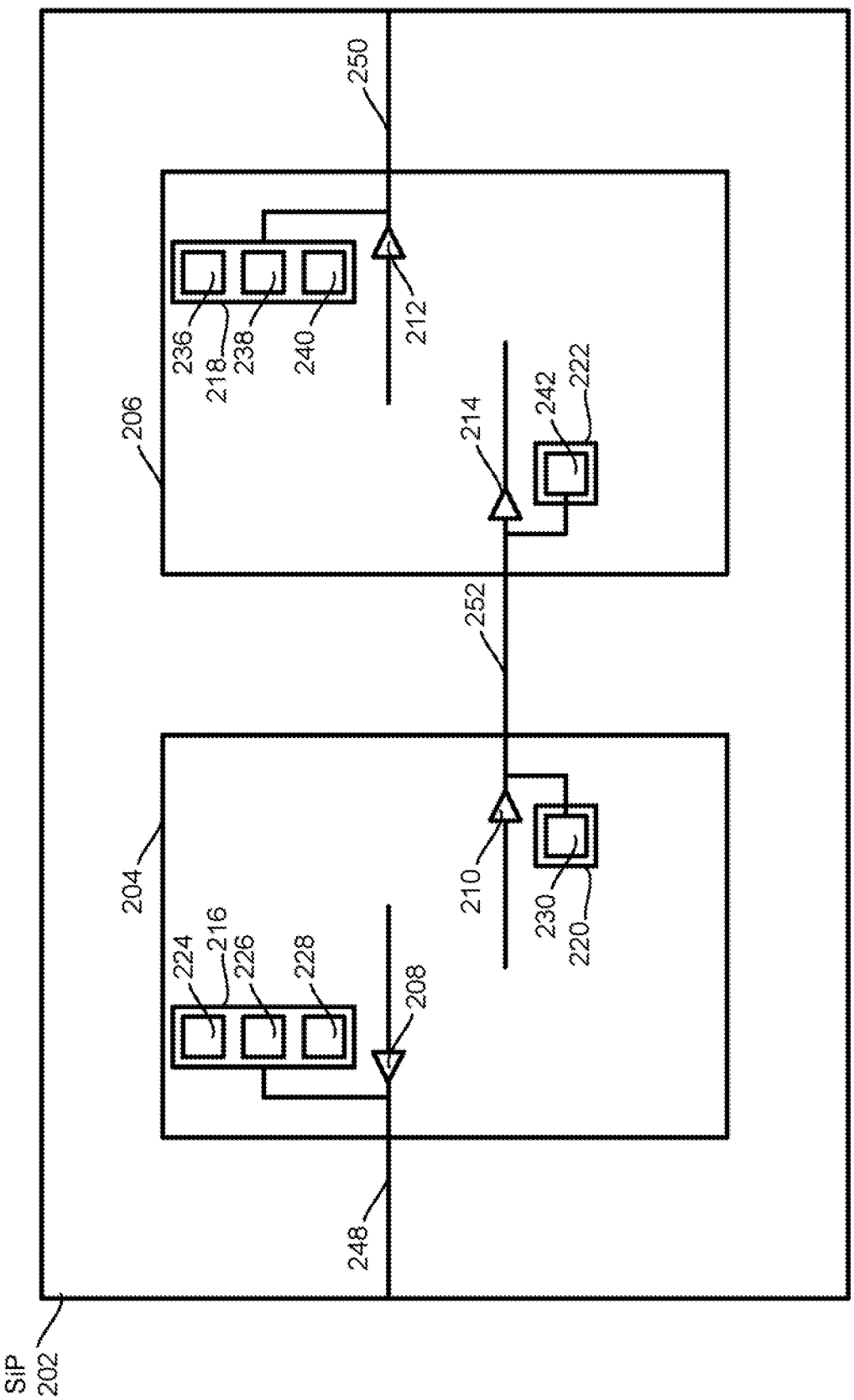
FIG. 2 shows, in an embodiment of the invention, an overall schematic diagram of a single multiple-integrated circuit package with a compact ESD arrangement.

FIG. 2 shows, in an embodiment of the invention, an overall schematic diagram of a single multiple-integrated circuit package with a compact ESD arrangement. As aforementioned, a compact ESD arrangement is an arrangement that may not include all three ESD components (i.e., HBM component, CDM component, and MM component). A single multiple-integrated circuit package, such as a SiP 202, may include a plurality of electronic parts, such as a die 204 and a die 206. As can be appreciated from the foregoing, other electronic parts, such as package parts, may also be integrated within SiP 202.

As aforementioned, dies are non-packaged form of package parts. Thus, dies may occupy less physical space and may be cheaper than package parts. Thus, in a desire to minimize the form factor of an electronic device, manufacturers may incorporate dies into the design of single multiple-integrated circuit packages.

Each die may include a plurality of I/O cells. In an example, die 204 may include an I/O cell 208 and an I/O cell 210. In another example, die 206 may include an I/O cell 212 and an I/O cell 214.

Since I/O cells 208 and 212 include connectors (e.g., pins) that enable the I/O cells to interact with electronic devices external to SiP 202, I/O cells 208 and 212 may be exposed to a variety of electrostatic discharges. Thus, to provide protection against possible electrostatic discharges from different sources (e.g., human touch, charged devices, machine, etc.), a standard ESD protective module may be coupled to the I/O cells. In an example, ESD protective module 216 may include a HBM component 224, a CDM component 226, and a MM component 228. Likewise, ESD protective module 218 may also include a HBM component 236, a CDM component 238, and a MM component 240.

In contrast, sonic I/O cells may only interact with I/O cells within SiP 202. In an example, I/O cells 210 and 214 may only interact with another. Since these I/O cells are protected within the encapsulation of SiP 202, the probability of the I/O cells coming into contact with electrostatic discharge that may be caused by a human touch and/or by charged devices may be highly unlikely. Thus, the ESD arrangement that may be coupled to the I/O cells may be a compact ESD arrangement.

In an embodiment, the compact ESD arrangement may include a set of ESD constructs. As discussed herein, an ESD construct may include one or more ESD components. ESD components that are combined into a single ESD construct may be controlled and/or may behave as a single unit.

In an embodiment a compact ESD arrangement may include at most two non-configurable ESD construct. Consider the situation wherein, for example, an I/O cell may never experienced a human touch and a charged device. As a result, I/O cell experience may most likely never experience electrostatic discharge from a human touch and/or by charged devices. For this type of I/O cell, a compact ESD arrangement may be utilized to minimize the form factor. In an example, I/O cell 210 may be coupled to a compact ESD arrangement 220, which may include a MM component 230. Similarly, I/O cell 214 may be coupled to a compact ESD arrangement 222, which may include a MM component 242. For both compact ESD arrangements 220 and 222, a single ESD construct with a MM component is attached to each ESD arrangement. As can be appreciated from the foregoing, the machine model components may be included in the compact ESD arrangements since the I/O cells may still be exposed to electrostatic discharge that may be generated when the I/O cells comes into contact with a metal surface. In an example, while assembling SiP 202, a machine (e.g., robot) may be employed to assemble die 204 within SiP 202.

As can be appreciated from the foregoing, the compact ESD arrangement is significantly smaller than the prior art ESD protective module. Accordingly, the overall size of the single multiple-integrated circuit package also becomes smaller. By integrating compact ESD arrangement into the design, the manufacturer is able to provide consumer with more functionality while reducing the form factor. In addition, delay that may be experienced by an I/O cell due to an ESD arrangement may be significantly reduced since preventable delay is substantially eliminated by removing the unnecessary ESD components (such as HBM component and CDM component in this example) from the compact ESD arrangement.

Figure 3A:
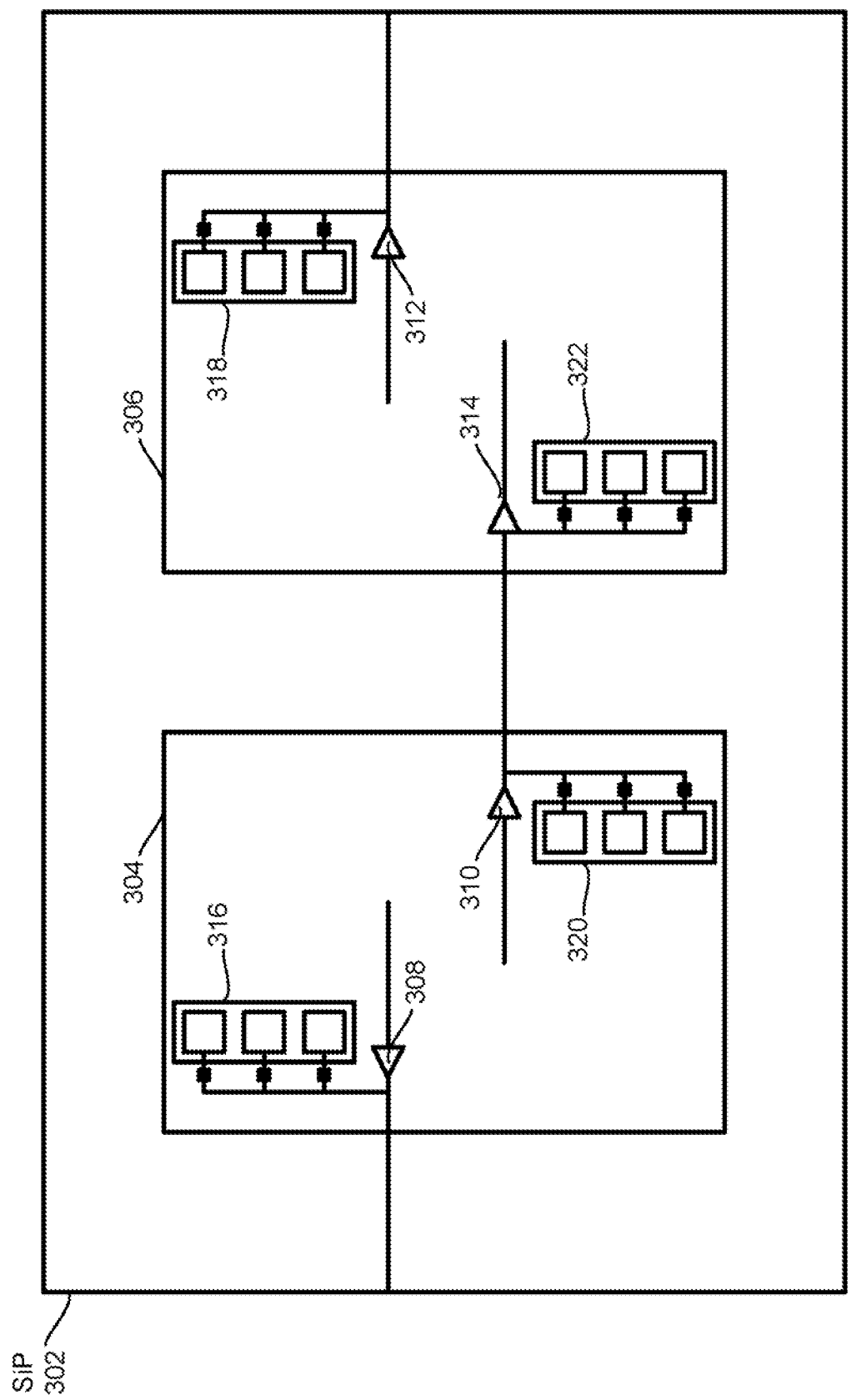
FIG. 3A shows, in an embodiment of the invention, a simple schematic diagram of a single multiple-integrated circuit package with a configurable ESD arrangement.

Alternatively or additionally, FIG. 3A shows, in an embodiment of the invention, a simple schematic diagram of a single multiple-integrated circuit package with a configurable ESD arrangement. A single multiple-integrated circuit package, such as a SiP 302, may include a plurality of electronic components, such as dies 304 and 306. Each die may include a plurality of I/O cells. In an example, die 304 may include an I/O cell 308 and an I/O cell 310. In another example, die 306 may include an I/O cell 312 and an I/O cell 314.

Each of the I/O cells may be coupled to a configurable ESD arrangement (316, 318, 320, and 322). In an embodiment, each configurable ESD arrangement may include all three ESD components (HBM component, CDM component, and MM component). Unlike the prior art ESD protective module, the components within a configurable ESD arrangement are optional.

Figure 3B:
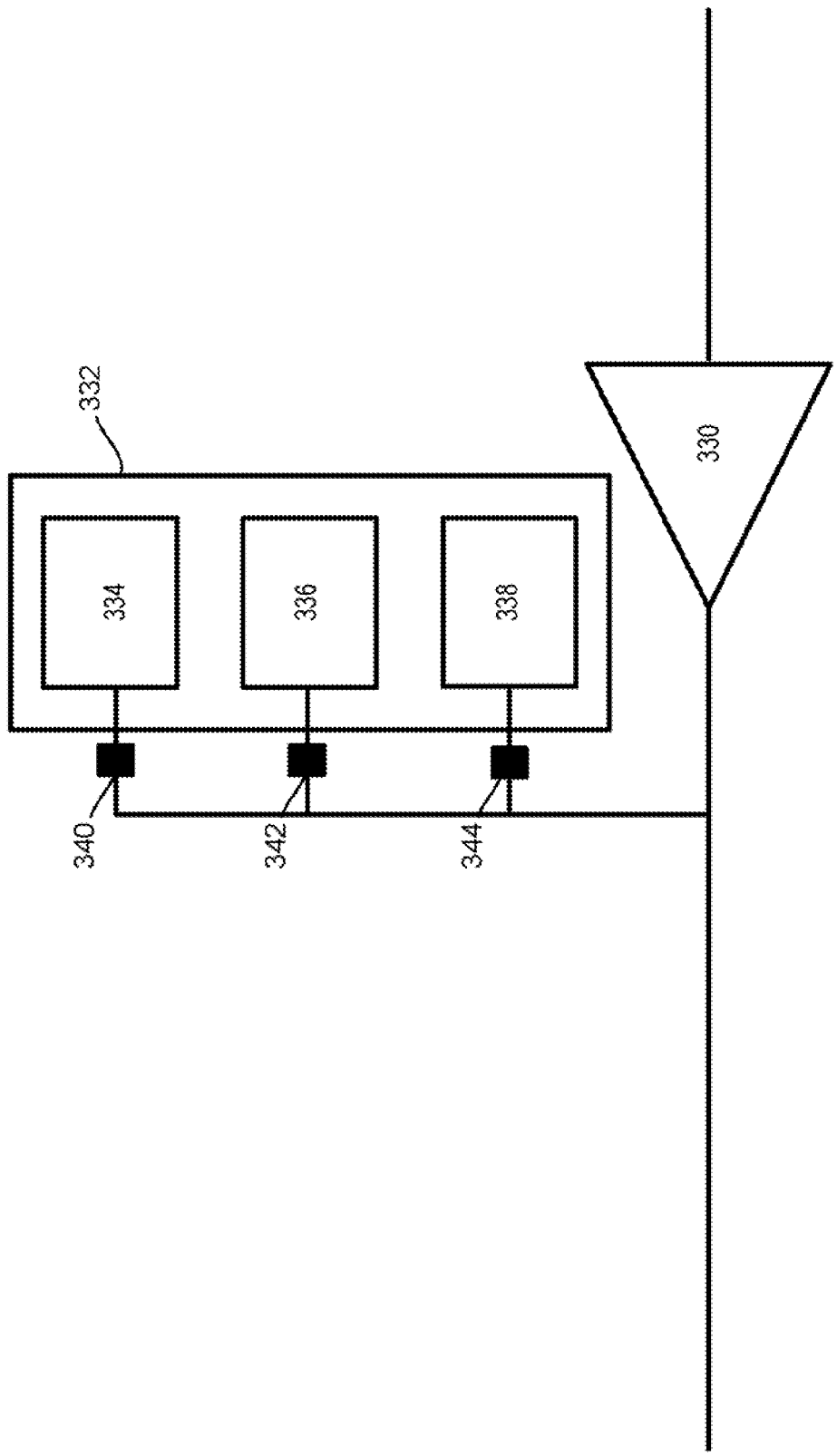
FIG. 3B shows, in an embodiment of the invention, a simple schematic of a configurable ESD arrangement.

To illustrate, FIG. 3B shows, in an embodiment of the invention, a simple schematic of a configurable ESD arrangement. Consider the situation wherein, for example, an I/O cell 330 is coupled to configurable ESD arrangement 332. Configurable ESD arrangement 332 may include at least a single construct (i.e., ESD construct). The single construct may include at least a single ESD component. In an example, configurable ESD arrangement 332 includes three constructs, each construct including an ESD component. In an example, the first construct includes a HBM component 334, the second construct includes a CDM component 336, and a third construct includes an MM component 338.

To activate or deactivate the ESD components, a set of switches may be provided. In an example, a switch 340 may be attached to a HBM component 334, a switch 342 may be attached to CDM component 336, and a switch 344 may be attached to a MM component 338. As can be appreciated from the foregoing, each switch may provide a connect status or a disconnect status, thereby enabling the configurable ESD arrangement to be manipulated.

Consider the situation wherein, for example, an I/O cell, such as I/O cell 330, is designed to interact with a device external to the single multiple-integrated circuit package. Since I/O cell 330 may be exposed to electrostatic discharge from a variety of sources (e.g., human touch, charged devices, machine, and the like), the switches to each of the components may be set to a connect status (set to "0") in order to activate the components. In an example, switches 340, 342, and 344 may be set to a connect status, thereby enabling configurable ESD arrangement 330 to activate the three constructs (HBM component 334, CDM component 336, and MM component 338, respectively) to protect I/O cell 330 from possible electrostatic discharge that may be generated.

However, if an I/O cell is designed to only interact with other I/O cells within the same package, then some of the components may be set to a disconnect status. In an example, switch 344 may be set to a connect status enabling MM component 338 to be activated to protect I/O cell 330 against possible electrostatic discharge that may be generated from contact with a metal surface, such as when I/O cell 330 is being assembled within the single multiple-integrated circuit package. Since the likelihood of I/O cell 330 experiencing electrostatic discharge created by a human touch or a charged device is substantially eliminated, switches 340 and 342 associated with HBM component 334 and CDM component 336, respectively, may be set to a disconnect status.

Figure 3C:
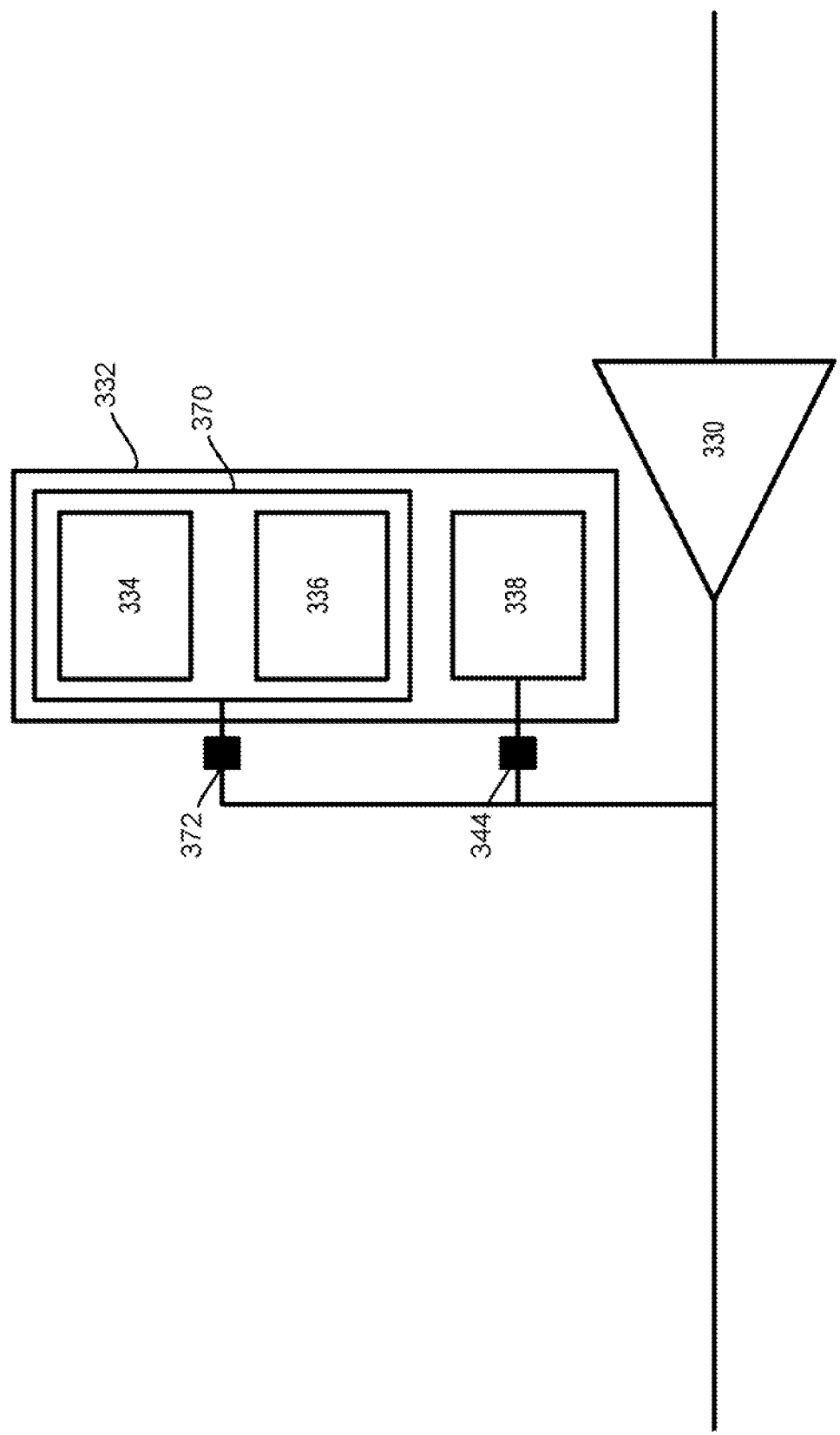
FIG. 3C shows, in an embodiment of the invention, a simple schematic of a configurable ESD arrangement with an integrated model.

In some situations, certain ESD components may have similar behaviors. In an example, the condition under which an I/O cell may experience electrostatic discharge due to a human touch may also cause the I/O cell to experience electrostatic discharge due to a charged device. As a result, the ESD components that may experience similar behavior may be integrated as a single construct. In an example, HBM component 334 and CDM component 336 may be integrated as a single construct, such as an integrated construct 370 of FIG. 3C. Thus, instead of having two switches to connect and/or disconnect the two ESD components (e.g., HBM component 334 and CDM component 336), a single switch 372 may be employed to control integrated construct 370. As can be appreciated from the foregoing, the combination of ESD components that may behave as a single construct may vary depending upon the condition experienced by an I/O cell.

As can be appreciated from one or more embodiments of the present invention, a single multiple-integrated circuit package with an ESD arrangement is provided. By utilizing an ESD arrangement to handle the electrostatic discharge that may be generated, at least one of size and delay may be substantially reduced. In addition, needless power consumption may be substantially eliminated since ESD components that are unnecessary to the function of an I/O cell may be removed or turn off. Thus, with an ESD arrangement, the single multiple-integrated circuit arrangement may provide overall increase performance yield and/or smaller form factor, thereby satisfying consumer's demand for smaller but more powerful electronic devices.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted, that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A single package arrangement, comprising:
   a set of electronic components;
   a set of input/output (I/O) cells, said set of I/O cells being included within said set of electronic components; and
   a set of electrostatic discharge (ESD) arrangements, each ESD arrangement of said set of ESD arrangements being configured for at least
   coupling with an I/O cell of said set of I/O cells, and
   protecting said I/O cell from said electrostatic discharge using a set of ESD constructs,
   said set of ESD constructs including at most two non-configurable ESD constructs and at least one configurable construct to protect said I/O cell of said set of I/O cells from said electrostatic discharge.

2. The arrangement of claim 1 wherein said set of electronic components includes a set of dies.

3. The arrangement of claim 1 wherein said set of ESD constructs includes a set of ESD components.

4. The arrangement of claim 3 wherein said set of ESD arrangements includes a single ESD construct, said ESD construct including a machine model component.

5. The arrangement of claim 3 wherein said set of ESD components includes at least one of a human body model component, a charged device model component, and a machine model component.

6. The arrangement of claim 1 wherein a first ESD arrangement of said set of ESD arrangements includes a set of ESD constructs, each of said set of ESD constructs being electrically coupled to a switch, said switch being configured to perform at least one of activating and deactivating at least one ESD construct within said first ESD arrangement.

7. The arrangement of claim 6 wherein said first ESD arrangement includes at least two configurable ESD constructs.

8. The arrangement of claim 7 wherein a first ESD construct of said at least two configurable ESD constructs includes a single ESD component and a second ESD construct of said at least two configurable ESD constructs includes two ESD components.

9. The arrangement of claim 8 wherein said first ESD construct includes a machine model component and said second ESD construct includes a human body model component and a charged device model component.

10. The arrangement of claim 1 wherein said set of electronic components includes a set of package parts.

11. A single multiple-integrated circuit package arrangement, comprising:
    a set of electronic components;
    a set of input/output (I/O) cells, said set of I/O cells being included in said set of electronic components; and,
    a set of configurable electrostatic discharge (ESD) arrangements, each ESD arrangement of said set of configurable ESD arrangements including a set of ESD constructs, wherein at least one of said set of ESD constructs being configured for at least coupling with an I/O cell of said set of I/O cells, and electrically coupled to a switch, said switch being configured to perform at least one of an activating and deactivating of at least said one of said set of ESD constructs.

12. The arrangement of claim 11 further wherein said set of ESD constructs including at most two non-conformable ESD constructs to protect said I/O cell of said set of I/O cells from said electrostatic discharge.

* * * * *